US011515213B2

(12) United States Patent
Chen et al.

(10) Patent No.: US 11,515,213 B2
(45) Date of Patent: Nov. 29, 2022

(54) METHOD OF FORMING A SEMICONDUCTOR DEVICE

(71) Applicant: UNITED MICROELECTRONICS CORP., Hsin-Chu (TW)

(72) Inventors: Chih-Chung Chen, Tainan (TW); Po-Chang Lin, Tainan (TW); Huang-Ren Wei, Tainan (TW); Wei-Lun Chou, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 150 days.

(21) Appl. No.: 17/143,179

(22) Filed: Jan. 7, 2021

(65) Prior Publication Data

US 2022/0208612 A1   Jun. 30, 2022

(30) Foreign Application Priority Data

Dec. 25, 2020   (CN) .......................... 202011558413.3

(51) Int. Cl.
*H01L 21/8234* (2006.01)
*H01L 21/266* (2006.01)
*H01L 21/02* (2006.01)
*H01L 21/311* (2006.01)

(52) U.S. Cl.
CPC .. *H01L 21/823418* (2013.01); *H01L 21/0206* (2013.01); *H01L 21/266* (2013.01); *H01L 21/31133* (2013.01)

(58) Field of Classification Search
CPC ......... H01L 21/823418; H01L 21/0206; H01L 21/266; H01L 21/31133
See application file for complete search history.

(56) References Cited

U.S. PATENT DOCUMENTS

2008/0214008 A1\*   9/2008   Moritoki ........... H01L 21/31138
257/E21.252

\* cited by examiner

*Primary Examiner* — David Vu
(74) *Attorney, Agent, or Firm* — Winston Hsu

(57) ABSTRACT

A method for forming a semiconductor device. A substrate having a first region and a second region surrounding the first region is provided. The first region includes a first active area and a first gate. A dummy pattern is disposed on the substrate within the second region around a perimeter of the first region. A resist pattern masks the second region and includes an opening that exposes the first region. An ion implantation process is performed to implant dopants through the opening into the first active area not covered by the first gate within the first region, thereby forming doped regions in the first active area. A resist stripping process is performed to remove the resist pattern by using a sulfuric acid-hydrogen peroxide mixture (SPM) solution at a temperature that is higher than or equal to 120~190 degrees Celsius. The substrate is subjected to a cleaning process.

16 Claims, 2 Drawing Sheets

METHOD OF FORMING A SEMICONDUCTOR DEVICE

BACKGROUND OF THE INVENTION

1. Field of the Invention

The present invention relates to the field of semiconductor technology, in particular to a method of forming a semiconductor device.

2. Description of the Prior Art

It is known that when performing an ion implantation process, for example, a lightly doped drain (LDD) ion implantation, during the semiconductor manufacturing, a photoresist pattern is usually needed to mask regions on the semiconductor substrate that are not desired to be ion implanted.

When the thickness of the photoresist pattern is thick, the high-dose LDD ion implantation step described above will produce a crust on the surface of the photoresist pattern, which is easy to crack and cause defects, especially those formed on the peripheral sidewall of the photoresist pattern. The crust may cause defects such as pattern collapse during the subsequent removal of the photoresist pattern, which affects the production yield.

SUMMARY OF THE INVENTION

It is one object of the present invention to provide an improved method for forming a semiconductor device to solve the above-mentioned shortcomings or deficiencies of the prior art.

According to one aspect of the invention, a method for forming a semiconductor device is disclosed. A substrate is provided. The substrate has a first region and a second region surrounding the first region. The first region comprises at least one first active area and a first gate on the first active area. A dummy pattern is disposed on the substrate within the second region around a perimeter of the first region. A resist pattern is disposed on the substrate. The resist pattern masks the second region and comprises an opening that exposes the first region. An ion implantation process is performed to implant dopants through the opening into the first active area not covered by the first gate within the first region, thereby forming doped regions in the first active area. A resist stripping process is performed to remove the resist pattern by using a sulfuric acid-hydrogen peroxide mixture (SPM) solution at a temperature that is higher than or equal to 120~190 degrees Celsius. The substrate is subjected to a cleaning process.

According to some embodiments, the second region comprises at least one second active area and a second gate on the at least one second active area.

According to some embodiments, the resist pattern masks the dummy pattern, the second region, the at least one second active area, and the second gate.

According to some embodiments, the dummy pattern is disposed between the at least one first active area and the at least one second active area.

According to some embodiments, crust develops on the resist pattern when performing the ion implantation process, and wherein the dummy pattern avoids the crust from attaching onto the second gate during the resist stripping process.

According to some embodiments, the SPM solution comprises $H_2SO_4$ and $H_2O_2$ in a 2:1~9:1 ratio.

According to some embodiments, the dummy pattern has a width greater than 120 nm.

According to some embodiments, the dummy pattern has a width greater than 150 nm.

According to some embodiments, a distance between the first gate and a sidewall of the resist pattern around the opening is greater than 1000 angstroms.

According to some embodiments, the sidewall of the resist pattern around the opening comprises a sloped upper sidewall portion.

According to some embodiments, the ion implantation process is a lightly doped drain (LDD) implantation process performed at an implant dose of greater than 1E14/cm², and wherein the doped regions are LDD regions.

According to some embodiments, the cleaning process is performed by using a wet clean solution comprising a mixture of ammonium hydroxide, hydrogen peroxide and water.

According to some embodiments, a volumetric ratio of ammonium hydroxide to hydrogen peroxide to water is about 1:1~10:10~100.

According to some embodiments, the dummy pattern is a strip-shaped polysilicon pattern.

According to some embodiments, the dummy pattern is disposed on a trench isolation region.

According to some embodiments, the substrate is a semiconductor substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1 to 4 illustrate a method of forming a semiconductor device, in which FIG. 1 illustrates a top view showing a dummy pattern and a photoresist pattern disposed on a semiconductor substrate, FIG. 2 is a cross-sectional view taken along the line I-I' in FIG. 1, FIG. 3 illustrates the LDD ion implantation process, and FIG. 4 illustrates the photoresist stripping process.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
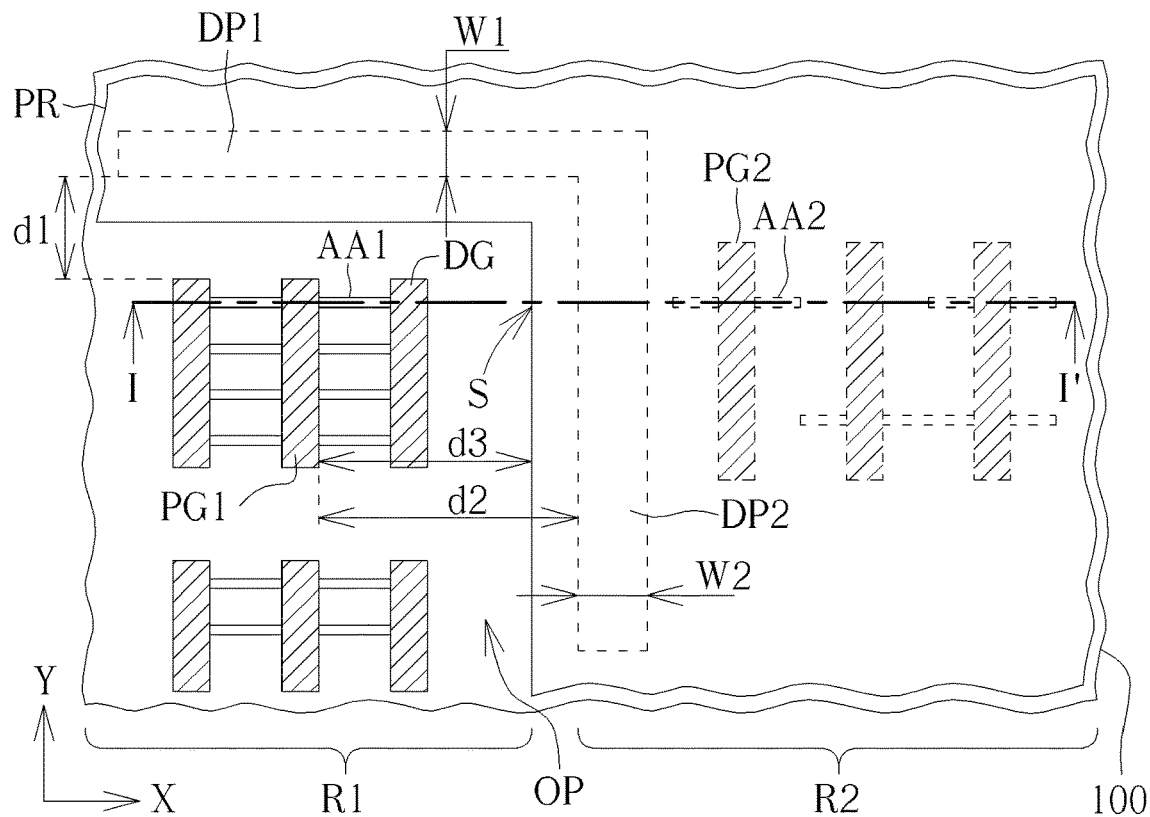
Figure 2:
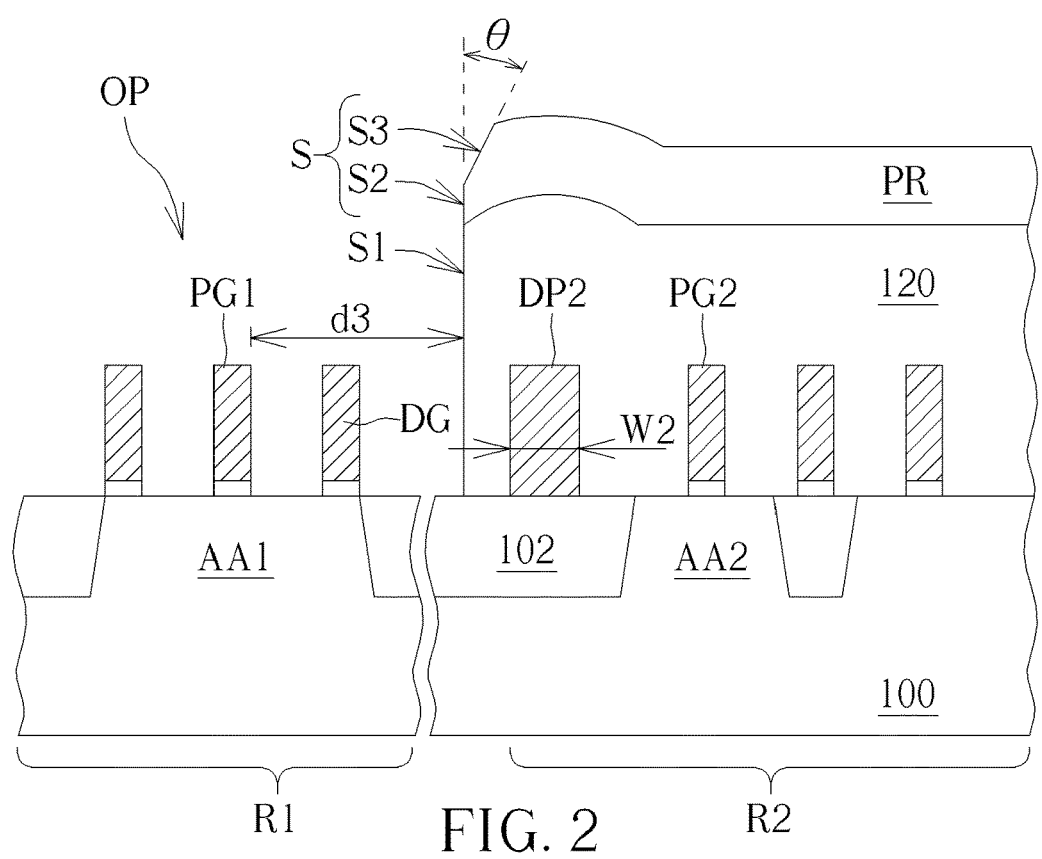
Figure 3:
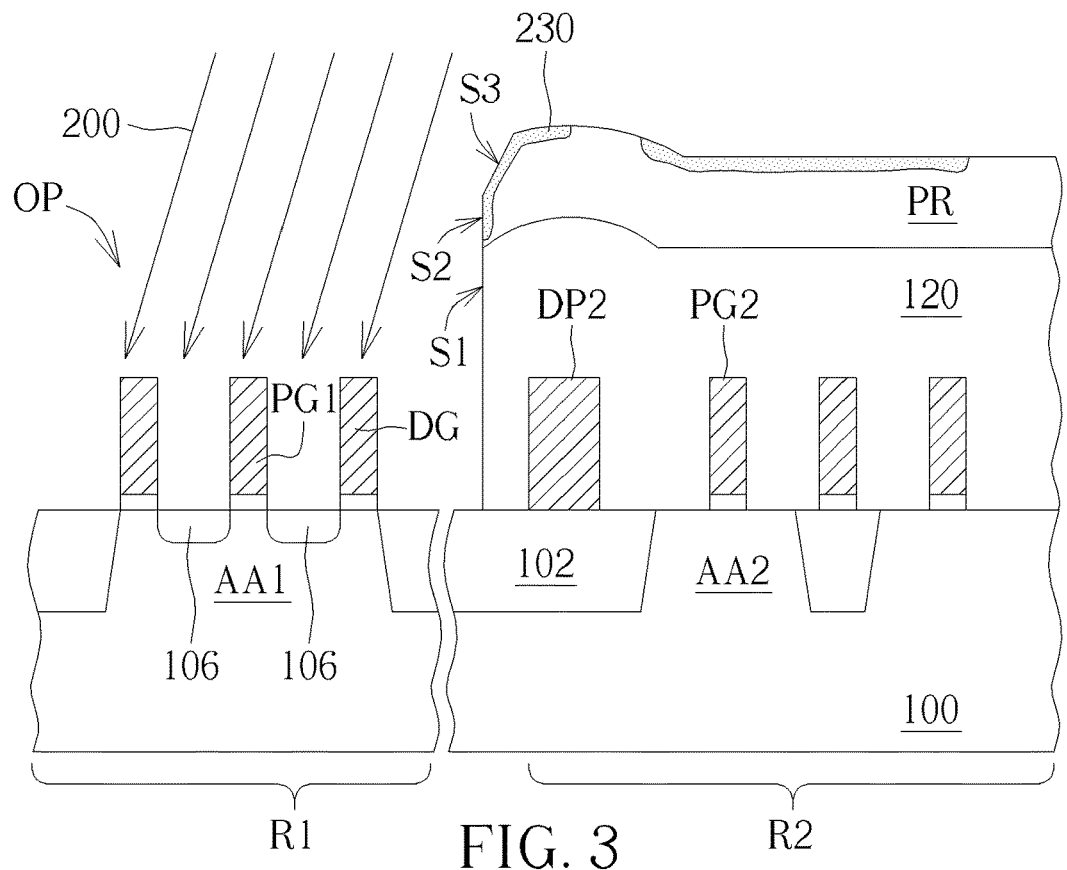
Figure 4:
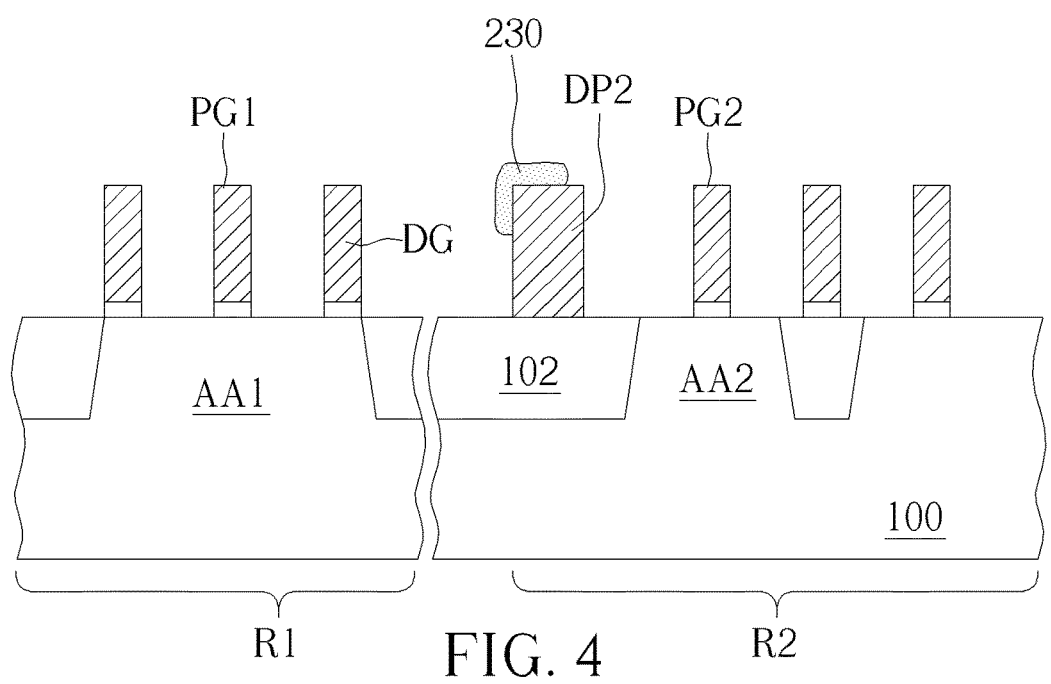

Please refer to FIGS. 1 to 4, which illustrate a method of forming a semiconductor device, in which FIG. 1 is a schematic top view of a dummy pattern provided on a semiconductor substrate for performing an ion implantation process according to an embodiment of the present invention, FIG. 2 is a cross-sectional view taken along line I-I' in FIG. 1, FIG. 3 illustrates the LDD ion implantation process, and FIG. 4 illustrates the photoresist stripping process.

As shown in FIGS. 1 and 2, first, a substrate 100, for example, a semiconductor substrate, is provided with a first region R1 and a second region R2 surrounding the first region R1. According to an embodiment of the present invention, for example, the first region R1 may be an input/output (IO) circuit region, but is not limited thereto. According to an embodiment of the present invention, for example, the second region R2 may be a logic core circuit region, but is not limited thereto. According to an embodiment of the present invention, the first region R1 includes at least one first active region AA1 and a first gate PG1 on the first active region AA1. It is to be understood that, to simplify the description, the first active area AA1 shown in FIG. 1 is only illustrative, and the number and layout of the first active area AA1 are not intended to be limited by the present disclosure.

According to an embodiment of the present invention, for example, the first active area AA1 may be a fin-type structure extending along the reference X-axis direction, but is not limited thereto. According to an embodiment of the present invention, for example, the first gate electrode PG1 may be a polysilicon fine line pattern that crosses the first active area AA1 and extends along the reference Y-axis direction. According to an embodiment of the present invention, for example, a dummy gate DG may be additionally provided at the end of the first active area AA1, but it is not limited thereto.

According to an embodiment of the present invention, the second region R2 may include at least one second active region AA2 and a second gate PG2 on the at least one second active region AA2. It is to be understood that, to simplify the description, the second active area AA2 shown in FIG. 1 is only illustrative, and the number and layout of the second active area AA2 are not intended to be limited by the present disclosure. According to an embodiment of the present invention, for example, the second active area AA2 may be a fin-shaped structure extending along the reference X-axis direction, but is not limited thereto. According to an embodiment of the present invention, for example, the second gate electrode PG2 may be a polysilicon fine line pattern that crosses the second active area AA2 and extends along the reference Y-axis direction. According to an embodiment of the present invention, the above-mentioned polysilicon fine line pattern can be replaced by a metal gate in the subsequent manufacturing process.

According to an embodiment of the present invention, a dummy pattern DP1 and a dummy pattern DP2 may be provided on the substrate 100 in the second region R2 around the first region R1. According to an embodiment of the present invention, the dummy patterns DP1 and DP2 are disposed between the first active area AA1 and the second active area AA2. According to an embodiment of the present invention, the dummy pattern DP1 may be a strip-shaped pattern extending along the reference X-axis direction, and the dummy pattern DP2 may be a strip-shaped pattern extending along the reference Y-axis direction. According to an embodiment of the present invention, the aforementioned strip pattern may be a strip polysilicon pattern, but is not limited thereto. According to an embodiment of the present invention, the dummy pattern DP1 and the dummy pattern DP2 may be connected to each other, and form a ring or box-shaped pattern, which continuously surrounds the first region R1.

According to an embodiment of the present invention, the width W1 of the dummy pattern DP1 is greater than 120 nm, preferably greater than 150 nm. According to an embodiment of the present invention, the width W2 of the dummy pattern DP2 is greater than 120 nm, preferably greater than 150 nm. According to an embodiment of the present invention, the width W1 of the dummy pattern DP1 may be equal to the width W2 of the dummy pattern DP2. In some embodiments, the width W1 of the dummy pattern DP1 may not be equal to the width W2 of the dummy pattern DP2. According to an embodiment of the present invention, for example, the distance d1 between the dummy pattern DP1 and the first gate PG1 may be greater than 1500 angstroms. According to an embodiment of the present invention, for example, the distance d2 between the dummy pattern DP2 and the first gate PG1 may be greater than 1500 angstroms.

According to an embodiment of the present invention, as shown in FIG. 2, for example, the dummy patterns DP1 and DP2 may be disposed on a trench isolation region 102. For example, the trench isolation region 102 may be a shallow trench isolation (STI) region.

According to an embodiment of the present invention, in order to facilitate the subsequent ion implantation process, for example, a lightly doped drain (LDD) implantation process to implant predetermined dopants into the first active region AA1 in the first region R1, at this point, a photoresist pattern PR needs to be provided on the substrate 100. The photoresist pattern PR substantially covers the second region R2 and includes an opening OP exposing the first region R1. The step of forming the photoresist pattern PR is a well-known technique, so the details will not be repeated. For example, the steps of forming the photoresist pattern PR generally include photoresist spin coating, baking, exposure, development, and cleaning, but are not limited thereto. According to an embodiment of the present invention, the photoresist pattern PR masks the dummy patterns DP1 and DP2, the second region R2, the second active region AA2, and the second gate PG2.

As shown in FIG. 2, generally, under the photoresist pattern PR is a bottom anti-reflection layer 120. For example, the thickness of the bottom anti-reflection layer 120 may be between 3600 angstroms and 3700 angstroms. According to an embodiment of the present invention, the bottom anti-reflective layer 120 generally has a sidewall S1 approximately perpendicular to the surface of the substrate 100 and connected upward to the sidewall S of the photoresist pattern PR, which includes a vertical sidewall S2 and an inclined or sloped upper sidewall portion S3. According to an embodiment of the present invention, there is an included angle θ between the inclined upper sidewall portion S3 and the sidewall S1, wherein the included angle θ may be greater than 30 degrees, for example, greater than 35 degrees. According to an embodiment of the present invention, the distance d3 between the first gate electrode PG1 and the sidewall S of the photoresist pattern PR is preferably greater than 1000 angstroms.

As shown in FIG. 3, the method of forming a semiconductor device of the present invention includes: performing an ion implantation process 200 to implant dopants into the first region R1 through the opening OP of the photoresist pattern PR without being covered by the first gate PG1 in the first active area AA1, thereby forming doped regions 106 in the first active area AA1. According to an embodiment of the present invention, for example, the ion implantation process 200 is a tilt-angle LDD implantation process performed with a dose greater than $1E14/cm^2$, wherein the doped regions 106 are LDD regions. According to an embodiment of the present invention, when the ion implantation process 200 is performed, a crust 230 develops on the photoresist pattern PR.

As mentioned above, the crust generated on the photoresist pattern PR is easy to crack and cause defects. The crust 230 formed on the sidewalls S2 and S3 of the photoresist pattern PR are most likely to cause defects such as pattern collapse during the subsequent removal of the photoresist pattern PR, thereby affecting the production yield. The present invention addresses this issue by providing the dummy patterns DP1 and DP2 on the substrate 100, and the crust 230 is prevented from being attached to the second gate PG2 during the photoresist stripping process.

As shown in FIG. 4, a photoresist stripping process is then performed to remove the photoresist pattern PR and the bottom anti-reflection layer 120 below the photoresist pattern PR. According to an embodiment of the present invention, the photoresist stripping process is an all wet process, that is, no dry step, such as oxygen plasma, is used in the photoresist removal process in order to avoid dopant loss in the LDD region.

According to an embodiment of the present invention, for example, the photoresist stripping process may be performed using a sulfuric acid and hydrogen peroxide (SPM) solution at a temperature higher than or equal to 120~190 degrees Celsius. According to an embodiment of the present invention, for example, the SPM solution contains $H_2SO_4$ and $H_2O_2$ in a 2:1-9:1 ratio. Subsequently, the substrate 100 is subjected to a cleaning process. According to an embodiment of the present invention, for example, the cleaning treatment is performed by using a wet clean solution containing a mixture of ammonium hydroxide, hydrogen peroxide, and water. According to an embodiment of the present invention, for example, a volumetric ratio of ammonium hydroxide to hydrogen peroxide to water is about 1:1~10: 10~100.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device, comprising:

providing a substrate having a first region and a second region surrounding the first region, wherein the first region comprises at least one first active area and a first gate on the first active area;

disposing a dummy pattern on the substrate within the second region around a perimeter of the first region;

disposing a resist pattern on the substrate, wherein the resist pattern masks the second region and comprises an opening that exposes the first region;

performing an ion implantation process to implant dopants through the opening into the first active area not covered by the first gate within the first region, thereby forming doped regions in the first active area;

performing a resist stripping process to remove the resist pattern by using a sulfuric acid-hydrogen peroxide mixture (SPM) solution at a temperature that is higher than or equal to 120~190 degrees Celsius; and subjecting the substrate to a cleaning process.

2. The method according to claim 1, wherein the second region comprises at least one second active area and a second gate on the at least one second active area.

3. The method according to claim 2, wherein the resist pattern masks the dummy pattern, the second region, the at least one second active area, and the second gate.

4. The method according to claim 3, wherein the dummy pattern is disposed between the at least one first active area and the at least one second active area.

5. The method according to claim 4, wherein crust develops on the resist pattern when performing the ion implantation process, and wherein the dummy pattern avoids the crust from attaching onto the second gate during the resist stripping process.

6. The method according to claim 1, wherein the SPM solution comprises $H_2SO_4$ and $H_2O_2$ in a 2:1~9:1 ratio.

7. The method according to claim 1, wherein the dummy pattern has a width greater than 120 nm.

8. The method according to claim 1, wherein the dummy pattern has a width greater than 150 nm.

9. The method according to claim 1, wherein a distance between the first gate and a sidewall of the resist pattern around the opening is greater than 1000 angstroms.

10. The method according to claim 1, wherein the sidewall of the resist pattern around the opening comprises a sloped upper sidewall portion.

11. The method according to claim 1, wherein the ion implantation process is a lightly doped drain (LDD) implantation process performed at an implant dose of greater than $1E14/cm^2$, and wherein the doped regions are LDD regions.

12. The method according to claim 1, wherein the cleaning process is performed by using a wet clean solution comprising a mixture of ammonium hydroxide, hydrogen peroxide and water.

13. The method according to claim 12, wherein a volumetric ratio of ammonium hydroxide to hydrogen peroxide to water is about 1:1~10:10~100.

14. The method according to claim 1, wherein the dummy pattern is a strip-shaped polysilicon pattern.

15. The method according to claim 1, wherein the dummy pattern is disposed on a trench isolation region.

16. The method according to claim 1, wherein the substrate is a semiconductor substrate.

\* \* \* \* \*